United States Patent [19]

Frederick

[11] Patent Number: 5,083,101
[45] Date of Patent: Jan. 21, 1992

[54] INTEGRATED ELECTROMAGNETIC INTERFERENCE FILTER

[75] Inventor: W. Richard Frederick, Mundelein, Ill.

[73] Assignee: Integrated Power Components, Mundelein, Ill.

[21] Appl. No.: 460,573

[22] Filed: Jan. 3, 1990

[51] Int. Cl.$^5$ ............... H03H 7/00; H01F 27/24
[52] U.S. Cl. ................... 333/181; 333/12; 333/185; 336/212; 336/229; 361/328
[58] Field of Search ............... 333/177–181, 333/12, 184, 185; 336/212, 221, 229, 233; 361/328, 306, 310

[56] References Cited

U.S. PATENT DOCUMENTS

| | | | |
|---|---|---|---|
| 1,357,197 | 10/1920 | Brooks | 307/7 |
| 2,498,475 | 2/1950 | Adams | 336/212 X |
| 2,961,603 | 11/1960 | MacMillan | 324/34 |
| 2,975,384 | 3/1961 | Geiser | 336/77 |
| 3,149,296 | 9/1964 | Cox | 336/84 |
| 3,153,758 | 10/1964 | Kusters et al. | 324/55 |
| 3,170,133 | 2/1965 | Kernick | 336/165 |
| 3,218,547 | 11/1965 | Ling | 324/43 |
| 3,266,000 | 8/1966 | Markarian | 336/229 |
| 3,564,708 | 2/1971 | Harris | 29/606 |
| 3,675,176 | 7/1972 | Brown | 336/182 |
| 3,683,271 | 8/1972 | Kobayashi | 333/177 X |
| 4,205,288 | 5/1980 | Lin et al. | 333/212 X |
| 4,524,342 | 6/1985 | Mas | 336/182 |
| 4,633,368 | 12/1986 | Frederick | 361/328 |
| 4,694,140 | 9/1987 | Wheeler et al. | 219/130.1 |
| 4,910,482 | 3/1990 | Takagi et al. | 333/181 |

OTHER PUBLICATIONS

*Technical Notes*, "Understanding RFI Power Line Filters", Corcom.
"Switching Power Supplies, Radio Frequency Interference, & Power Line Interference Filters", by Werner Neuman, Corcom, Inc.

*Primary Examiner*—Eugene R. LaRoche
*Assistant Examiner*—Seung Ham
*Attorney, Agent, or Firm*—Arnold, White & Durkee

[57] ABSTRACT

An integrated electromagnetic interference filter includes an inductor assembly for attenuating both common mode and differential mode electromagnetic interference conducted emissions from electronic equipment. The inductor assembly includes an outer core of permeable material defining an outer window, and an inner core of permeable material disposed in the outer window and defining an inner window. A first power lead for connecting the equipment to a source of electrical power includes a portion wound in one direction about only the outer core. The inductor assembly includes a second power lead for connecting the equipment to the source of electrical power with a portion of the second lead wound about both the inner and outer cores in the opposite direction to the winding of the portion of the first power lead. The outer core provides a magnetic path for the attenuation of common mode emissions and the inner core provides a magnetic path for the attenuation of differential mode noise. The filter can also include a multiple function capacitor including three capacitive elements.

13 Claims, 2 Drawing Sheets

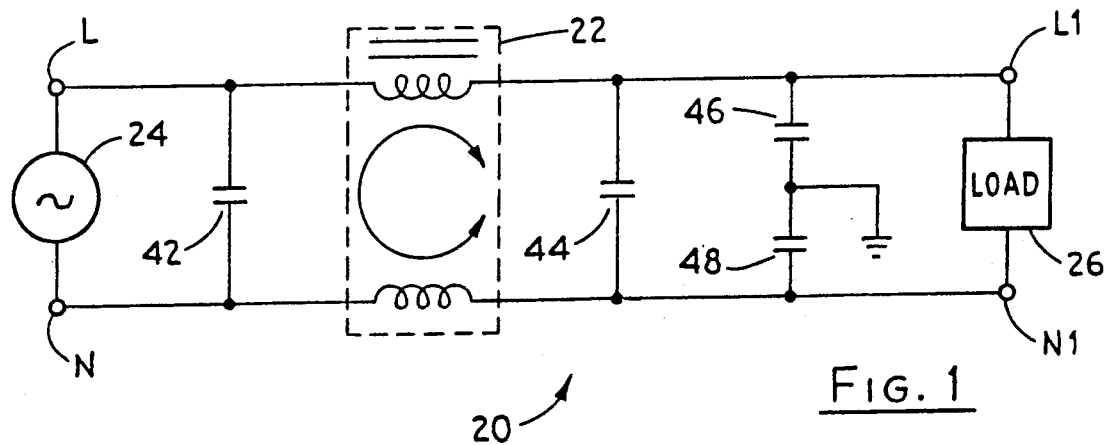
FIG. 1
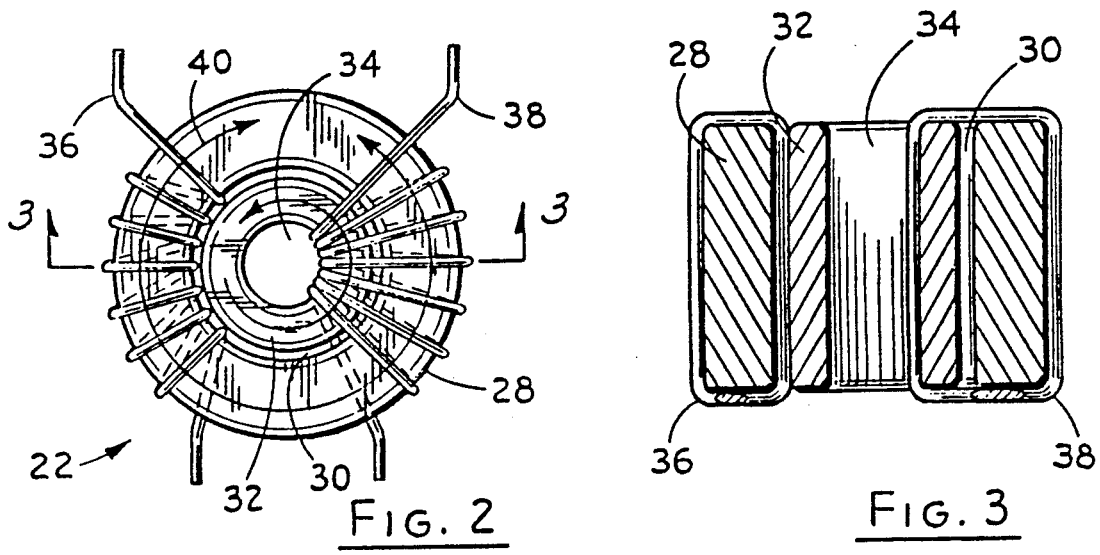
FIG. 2
FIG. 3
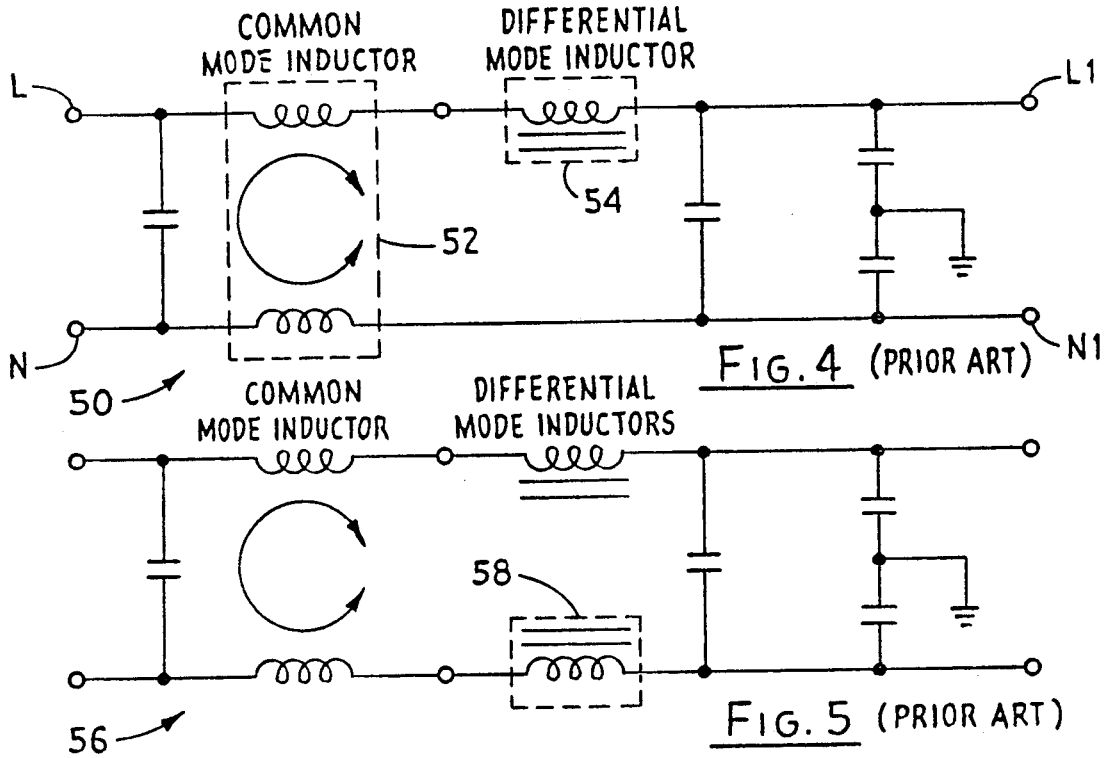
FIG. 4 (PRIOR ART)
FIG. 5 (PRIOR ART)

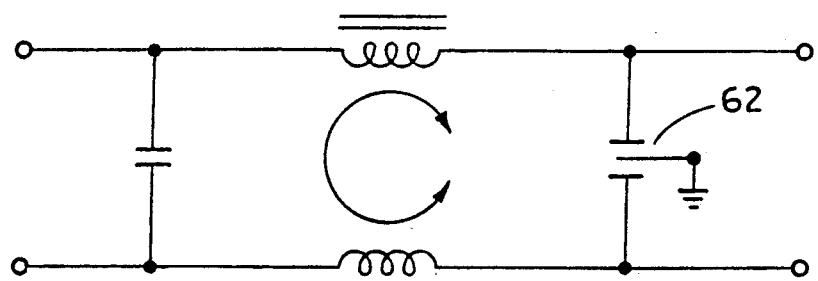
FIG. 6
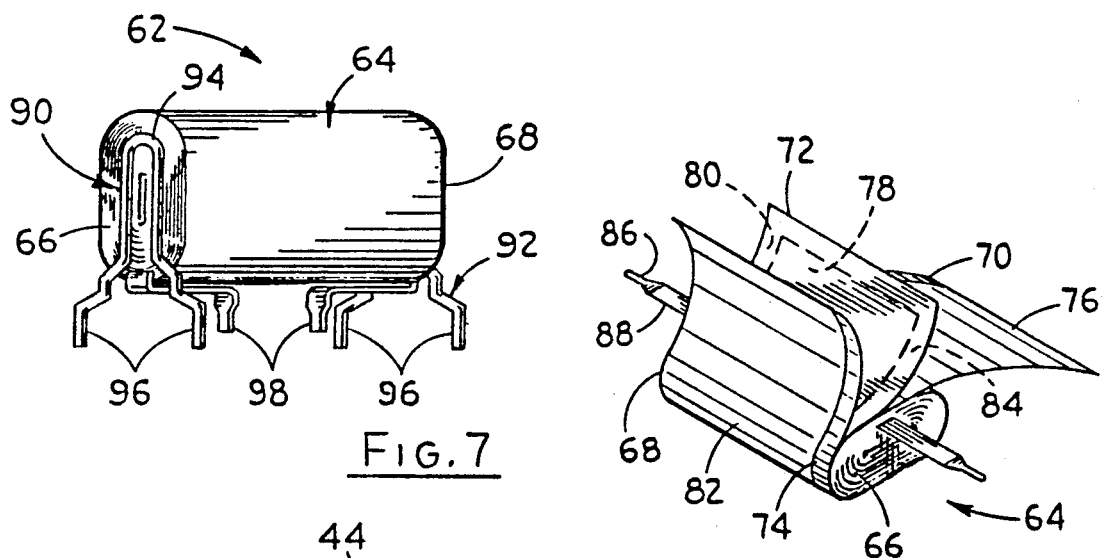
FIG. 7
FIG. 8
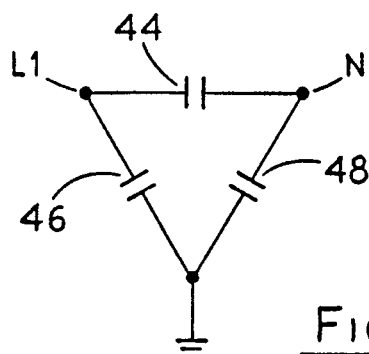
FIG. 9
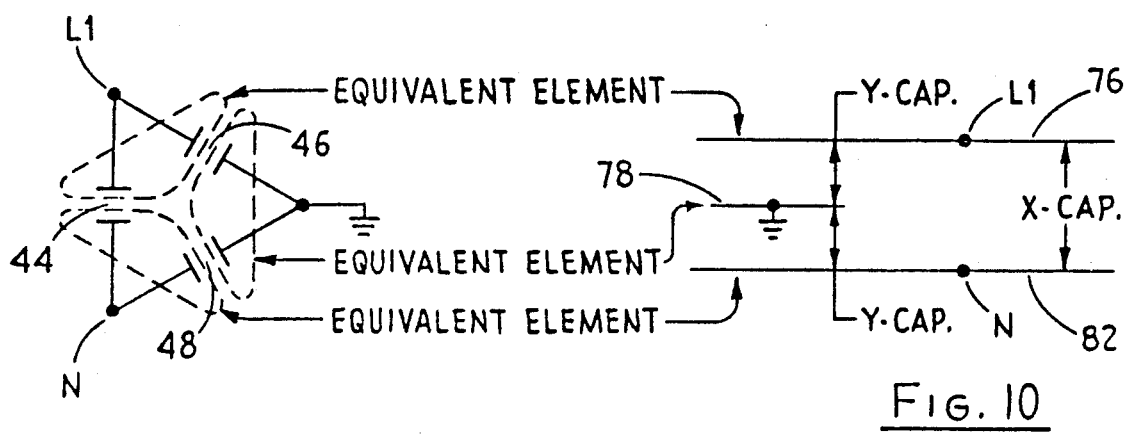
FIG. 10

INTEGRATED ELECTROMAGNETIC INTERFERENCE FILTER

This invention relates to electronic components and, more particularly, to an integrated filter inductor which combines a differential mode noise inductor and a common mode noise inductor into a single electronic component.

BACKGROUND OF THE INVENTION

Electronic equipment employing digital techniques, such as computing devices, and other electronic or electrical equipment such as switching power supplies cause radio frequency interference (RFI) which can both be radiated and conducted. RFI conducted over the power leads for the equipment occurs in a common mode and in a differential mode. Most of the conducted RFI is present as the common mode voltage which is measured with respect to both the line and the neutral conductors relative to ground. The differential mode conducted RFI is measured as a voltage between the line and the neutral conductors.

Designers and users of such equipment must be concerned with suppression of conducted RFI or noise because the noise can interfere with proper operation of other equipment which could be necessary to health and safety. Furthermore the U.S. Federal Communications Commission (FCC) and others have established regulations and standards regarding RFI emissions. For example, FCC Rules, Part 15, Subpart J concerns reduction of the interference potential of electronic computing devices. It is also desirable to protect equipment from outside noise, and to attenuate conducted noise without regard to its source.

It is known to place a power line interference filter between the power source and the equipment causing the RFI. Such a filter includes a common mode inductor having a core of permeable material with two windings, one winding part of the line conductor and the other winding part of the neutral conductor, and a differential mode inductor wound in one or both of the line and neutral. Such a filter also typically includes a first differential mode capacitor connected across the line and neutral between the common mode inductor and the power source, a second differential mode capacitor connected across the line and neutral between the inductors and the equipment, and a common mode capacitor connected from each of the line and neutral to ground. This filter arrangement requires 6 or 7 discrete components and a considerable amount of wire length which could either radiate RFI or receive radiated RFI. This is, in essence, a low pass filter. The impedance associated with the power source is relatively low, and at 60 Hz the impedance of the filter essentially matches that of the power source. However at frequencies in the range of 10 kHz to 30 mHz and above generally associated with common mode noise, and frequencies of 10 kHz to 500 kHz generally associated with differential mode noise, the filter acts as an impedance mismatching network to prevent conduction at those high frequencies. Such a filter is also useful in D.C. applications, such as in a D.C. to D.C. converter, where the converter noise can propagate down the D.C. busses so as to adversely affect other components of the system.

From U.S. Pat. No. 3,170,133 it is known to provide a transformer with inner and outer core sections. The outer core section defines a window and has an air gap, and the inner core section is nested within the outer. The first and second windings of the transformer are wound about the cross sections of both core sections, the concept being that for lower values of exciting current, the resulting magnetic flux would tend to concentrate in the inner core which would saturate at predetermined values of exciting current above which the additional magnetic flux would concentrate in the outer core section. Additional windings are shown only about one of the core sections for testing purposes to permit determination of the magnetic characteristics of the individual core sections.

SUMMARY OF THE INVENTION

Among the several aspects and features of the present invention may be noted the provision of an improved electromagnetic interference filter inductor and an RFI filter incorporating the inductor. The common mode inductor and the differential mode inductor are integrated into one discrete electronic component which generates less heat and which requires less wire and fewer turns resulting in less emitted and received radiated noise. Furthermore, the filter can incorporate a multiple function integrated capacitor which reduces the number of discrete electronic components needed for the filter to only three, making for a much small envelope for the filter components. The filter of the present invention has long service life, is reliable in use, and is relatively easy and economical to manufacture. Other aspects and features of the present invention will be, in part, apparent and, in part, pointed out specifically in the following specification and accompanying drawings.

Briefly, the electromagnetic interference filter embodying various aspects of the present invention includes a first conductor connected between the equipment and the power source, and a second conductor connected between the equipment and the power source. An outer core of permeable material defines an outer window in which is disposed an inner core of permeable material defining an inner window. The first conductor includes a first winding wound in one direction about only the outer core, while the second conductor includes a second winding which is wound in the opposite direction of the first winding and which is wound about both of the cores.

BRIEF DESCRIPTION OF THE DRAWINGS

FIG. 1 is an electrical schematic diagram of an electromagnetic filter assembly embodying various aspects of the present invention including an integrated inductor forming both a differential mode noise inductive element and a common mode noise inductive element;

FIG. 2 is a plan view of the integrated inductor of FIG. 1;

FIG. 3 is a sectional view of the integrated inductor taken generally along line 3—3 of FIG. 2;

FIGS. 4 and 5 are electrical schematic diagrams of prior art electrical filter assemblies;

FIG. 6 is an electrical schematic diagram of an alternative embodiment of the electromagnetic filter assembly of the present invention including a multiple function integrated capacitor;

FIG. 7 is a perspective view of the multiple function integrated capacitor of FIG. 6;

FIG. 8 is a perspective view of the winding of the multiple function integrated capacitor;

FIG. 9 is a schematic diagram of a delta capacitor circuit including an X capacitor and two Y capacitors; and FIG. 10 illustrates the equivalence of the multiple function capacitor and three discrete capacitors in a delta configuration.

Corresponding reference characters indicate corresponding components throughout the several views of the drawings.

DESCRIPTION OF THE PREFERRED EMBODIMENTS

Referring now to the drawings, an electromagnetic filter assembly including an integrated inductor 22 is generally indicated in FIG. 1 by reference numeral 20. The filter assembly 20 is for interconnection between a low frequency A.C. power source 24 (and also a D.C. power source) and electronic, electrical or electromechanical equipment 26, such as a device employing digital techniques or a switching power supply, the operation of which results in RFI. The inductor 22, as shown in FIG. 2, includes an outer core 28 of permeable material defining an outer window 30. An inner core 32 of permeable material is disposed in the outer window 30 and defines an inner window 34. A first power lead 36 which is connected to the lead L of the power source 24 is wound in one direction about the cross section of only the outer core 28. A second power lead 38 which is connected to the lead N of the power source is wound in the opposite direction about the cross sections of both the inner core 32 and the outer core 28, as also shown in FIG. 3. The outer core 28 is the common mode noise core and, as the two windings are wound in opposite directions, the magnetic lines of force resulting from the two windings tend to cancel each other (are balanced) as indicated by the two-headed arrow 40 so that it is unlikely that the core 28 will saturate. More specifically, the magnetic force lines which balance are those resulting from the "power current" going in opposite directions through the two windings. The common mode noise is traveling in the same direction in each winding, creating magnetic force lines which do not balance but are attenuated. However, the common mode noise is in the microamp range and does not cause saturation of the core. The inner core 32 is the differential mode core and provides an entirely different magnetic path for the magnetic lines of force resulting from the differential mode noise.

The filter assembly 20 also includes a first differential mode capacitor 42 connected across the power source leads L and N between the inductor 22 and the power source 24, and a second differential mode capacitor 44 connected across the power source leads L1 and N1 to the equipment or load 26 between the inductor 22 and the load. The filter assembly further comprises a first common mode capacitor 46 connected between lead L1 and ground, and a second common mode capacitor 48 connected between lead N1 and ground.

A prior art electromagnetic filter assembly 50 is shown in FIG. 4. This filter assembly has a common mode inductor 52 including a core about which is wound in opposite directions power leads connected to the power supply leads, respectively. Filter assembly 50 also includes a separate differential mode inductor 54 including a core and a power lead winding connected in series with a power lead winding of the common mode inductor 52 between leads L and L1. As the differential mode electromagnetic interference is present as a voltage between the line and neutral leads, it makes no difference whether the winding of the differential mode inductor is interconnected with the line lead or the neutral lead. FIG. 5 shows another prior art electromagnetic filter assembly 56 identical to assembly 50 except including a second differential mode inductor 58 interconnected with the neutral lead. This second differential mode inductor may be needed if the requirements of the application would cause the core of the first differential mode inductor to saturate. However, the second inductor 58 is most often added because of the economics of scale. That is, as more turns are added, the core window must be enlarged. This results in a longer magnetic path which is less efficient, requiring more turns. Thus, it may be more efficient to use the two inductors for ease of manufacture. It will be appreciated that these prior art filter assemblies require numerous discrete electronic components and substantial wiring.

More specifically, in the inductor 22 of the present invention shown in FIGS. 1-3 the outer core 28 has a permeability of preferably at least about 4500. A preferred material for the outer core is ferrite. The inner core 32 preferably has a permeability of at least about 70, and a preferred material is powdered iron. Each of the power leads 36 and 38 have substantially the same number of turns which is preferably in the range of 30 to 60.

Referring now to FIG. 6, an alternative embodiment of the filter assembly of the present invention is indicated by reference numeral 60. The filter assembly 60 is identical to filter assembly 20 except that capacitive elements corresponding to the second differential mode capacitor 44, the first common mode capacitor 46, and the second common mode capacitor 48 have been incorporated into a multiple function integrated capacitor 62, shown in FIG. 7. A partially completed winding 64 or body of the capacitor is shown in FIG. 8. The winding has a pair of ends 66, 68 and includes a first, a second and a third insulative layer (70, 72 and 74, respectively) extending substantially from one winding end 66 to the other winding end 68. A first electrode 76 which is disposed between layers 70 and 72 extends to winding end 66 but not to end 68. A second electrode 78 which is located between layers 72 and 74 terminates short of both winding ends with one lateral edge 80 of the electrode 78 in alignment with the inset edge of the electrode 76. The capacitor 62 includes a third electrode 82 positioned on the outside surface of the third layer 74 away from the winding end 68 and terminates short of the winding end 66, preferably in general registration with the corresponding edge 84 of the electrode 78.

Electrical contact is made with the first electrode 76 and the third electrode 82 by providing a conductive covering, i.e., metallizing, the winding ends 66 and 68. A conductive tab 86 contacts the second electrode 78 near the middle of its length with the tab having an insulated portion 88 located at the passage of the tab through the winding end 68 to prevent formation of a conductive path between the second electrode 78 and third electrode 82. It will be appreciated that the capacitor 62 integrates a trio of capacitive elements. The first and third electrodes 76, 82 form the plates of a first or X capacitor (e.g., differential mode capacitor 44) while the second and third electrodes 78, 82 and the first and second electrodes 76, 78 form the respective plates of a second and third capacitor (Y capacitors, e.g., common mode capacitors 46 and 48).

The capacitor 62 is particularly useful in the delta capacitor circuit shown in FIG. 9, which is the configuration of capacitors 44, 46 and 48. In this arrangement, the X capacitor 44 is connected between line L1 and neutral N. The Y capacitors 46, 48 are connected from L1 to ground and from N to ground, respectively. The equivalence of a delta circuit, using three discrete capacitors, to the capacitor 62 with the electrode 78 grounded, the electrode 76 connected to L1, and the electrode 82 connected to N is illustrated schematically in FIG. 10. The electrode 76 functions as a plate of capacitor 46 and a plate of capacitor 44. The electrode 78 performs the duties of a plate of capacitor 46 and a plate of capacitor 48. Finally, the electrode 82 is the equivalent of respective plates of capacitors 44, 48.

As shown in FIG. 7, the capacitor 62 also includes U-shaped leads 90, 92 fused to the respective metallized ends 66, 68 of the winding 64 for electrical connection to electrodes 76, 82, respectively. More specifically, each lead includes a bight portion 94 welded or soldered to a respective winding end, and a pair of parallel legs 96 extending away from the winding 64 generally parallel to tab ends 98. For further information concerning the structure and operation of this multiple function capacitor, reference may be made to U.S. Pat. No. 4,633,368, the teachings of which are incorporated herein by reference. However, it is contemplated that in the present filter application, the U-shaped leads be eliminated. A portion of each inductor lead can be tinned and welded to the cap ends (as are the U-shaped leads) to provide a more efficient connection.

The integrated inductor 22 combines a differential mode noise inductor and a common mode noise inductor into a single structure which significantly attenuates both common mode and differential mode EMI conducted emissions from electrical, electronic and electromechanical equipment. When the inductor 22 is used in the filter assembly 60, including the multiple function capacitor 62, the number of separate electronic components needed to form the assembly is reduced to only three. The filter assemblies 20 or 60 can be combined into a package and mounted at or near the power entry point or bulkhead into the equipment, or they can be mounted on the power supply printed circuit board usually near the power entry point.

It will be appreciated that the EMI filter assemblies of the present invention offer significant space savings because both a common mode inductor and a differential mode inductor are integrated into a single structure. The structure also requires lower labor costs both in its manufacture and use. In the manufacture, one of the two windings needed to produce a common mode coil, while being wrapped around the common mode core 28 is also wrapped about the differential mode core 32 installed within the structure. This provides a separate magnetic path for the attenuation of differential mode noise. Winding these two together in the same operation eliminates the need for a separate winding operation to wind a differential mode noise inductor. A combined structure also eliminates any need for stocking, installing or connecting a separate differential mode inductor or inductors as part of an EMI filter circuit.

The filter assembly of the present invention also results in reduced heat generation because of the elimination of the heat-producing windings of a separate differential mode inductor. There is consequently a reduced cooling need in the system, and there is a general lowering of the temperature in the system which also helps to improve overall efficiency. The filter assembly of the present invention also has improved performance over prior art filter assemblies because of the elimination of a separate differential mode inductor which reduces the wire length and area that either radiates or receives radiated EMI energy, which can cause coupling deficiencies. It also eliminates resonances between separate inductor elements as they go through phase changes over the frequency range. A further advantage is improved reliability because of the reduced heat, part count and fewer connections.

In view of the above, it will be seen that the several objects of the invention are achieved and other advantages results are attained.

As various changes could be made in the above constructions without departing from the scope of the invention, it is intended that all matter contained in the above description or shown in the accompanying drawings shall be interpreted as illustrative and not in a limiting sense.

What is claimed is:

1. An inductor assembly for attenuating both common mode and differential mode electromagnetic interference conducted emissions from electrical, electronic, or electromechanical equipment, said inductor assembly comprising:
   an outer core of permeable material defining an outer window;
   an inner core of permeable material disposed in said outer window and defining an inner window;
   a first power lead for connecting said equipment to a source of electrical power said first lead being wound about only said outer core;
   a second power lead for connecting said equipment to said source of electrical power, said second lead being wound about both said cores to produce an unbalanced field in said inner core in response to differential-mode interference, thereby attenuating said differential-mode interference,
   said first and second leads being wound to produce a balanced field in said outer core in response to the power current flow in said first and second power leads, and to produce an unbalanced field in said outer core in response to common-mode interference, thereby attenuating said common-mode interference.

2. An inductor assembly as set forth in claim 1 wherein said outer core has a permeability of at least about 4500.

3. An inductor assembly as set forth in claim 1 wherein said outer core is formed of ferrite.

4. An inductor assembly as set forth in claim 1 wherein said inner core has a permeability of at least about 70.

5. An inductor assembly as set forth in claim 1 wherein said inner core is formed of powdered iron.

6. An inductor assembly as set forth in claim 1 wherein each of said power leads have substantially the same number of turns.

7. An inductor assembly as set forth in claim 6 wherein the turns of each of said power leads is in the range of 30 to 60.

8. An electromagnetic interference filter adapted for connection between electrical, electronic or electromechanical equipment the operation of which causes noise, and a power source for said equipment, said filter comprising:

a first conductor connected between said equipment and said power source;

a second conductor connected between said equipment and said power source;

an inner core of permeable material disposed in said outer window and defining an inner window, said first conductor including a first winding wound about only said outer core, said second conductor including a second winding which is wound about both of said cores to produce an unbalanced field in said inner core in response to differential-mode interference, thereby attenuating said differential-mode interference, said first and second windings being wound to produce a balanced field in said outer core in response to the power current flow in said first and second windings, and to produce an unbalanced field in said outer core in response to common-mode interference, thereby attenuating said common-mode interference, a first differential mode noise capacitor connected across said conductors and between said power source and said windings;

a second differential mode noise capacitive element connected across said conductors and between said windings and said equipment;

a first common mode capacitive element connected from said first conductor to ground adjacent said second differential mode capacitor; and a second common mode capacitive element connected from said second conductor to ground adjacent said second differential mode capacitor whereby said filter assembly passes low frequency conducted power and filters high frequency conducted common mode and differential mode noise emissions.

9. An electromagnetic interference filter adapted for connection between electrical, electronic or electromechanical equipment the operation of which causes noise, and a power source for said equipment, said filter comprising:

a capacitor winding having a pair of ends and including a first, a second and a third insulative layer with each of said layers extending substantially from one end of said capacitor winding to the other end of said capacitor winding;

a first electrode disposed between said first and second insulative layers;

a second electrode disposed between said second and third layers;

a third electrode positioned on the outside of said third layer away from said second electrode, one of said electrodes extending to said one end of said capacitor winding and short of the other end of the capacitor winding, another of said electrodes terminating short of said one end and extending to said other end, and the remaining electrode extending intermediate said ends and terminating short of each of said ends;

a conductive tab electrically connected to said remaining electrode and extending beyond said one winding end, said tab being insulated at the location where it passes aid one end;

conductive means at least partially covering said winding one end, making electrical contact with multiple turns of said one electrode and including a lead;

conductive means at least partially covering said winding other end, making electrical contact with multiple turns of the other electrode and including a lead; and at least one inductor comprising an outer core of permeable material defining an outer window;

an inner core of permeable material disposed in said outer window and defining an inner window, said first conductor including an first winding wound about only said outer core, said second conductor including a second winding which is wound about both of said cores to produce an unbalanced field in said inner core in response to differential-mode interference, thereby attenuating said differential-mode interference, said first and second windings being wound to produce a balanced field in said outer core in response to the power current flow in said first and second windings, and to produce an unbalanced field in said outer core in response to common-mode interference, thereby attenuating said common-mode interference, said inductor having a first lead connected to said conductive means making electrical contact with said one electrode, and a second lead connected to said conductive means making electrical contact with said other electrode.

10. An electromagnetic interference filter as set forth in claim 9 wherein said first electrode is said one of said electrodes, said third electrode is another of said electrodes, and said second electrode is said remaining electrode.

11. An electromagnetic interference filter as set forth in claim 10 wherein said first electrode is a metallization formed on said first insulative layer and said third electrode is a metallization formed on said third insulative layer.

12. An electromagnetic interference filter as set forth in claim 11 wherein said first and third layers are formed of a plastic film.

13. An electromagnetic interference filter as set forth in claim 9 wherein said conductive means in electrical contact with said one electrode is a weldment between said first lead of said inductor and said one electrode, and said conductive means in electrical contact with said other electrode is a weldment between said second lead of said inductor and said other electrode.

* * * * *